(12) United States Patent
Takakusaki et al.

(10) Patent No.: US 7,710,725 B2
(45) Date of Patent: May 4, 2010

(54) ELECTRONIC APPARATUS AND DAUGHTERBOARD

(75) Inventors: Masahiko Takakusaki, Fussa (JP); Minoru Enomoto, Higashiyamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 12/119,439

(22) Filed: May 12, 2008

(65) Prior Publication Data

US 2009/0073655 A1    Mar. 19, 2009

(51) Int. Cl.
*H05K 7/20* (2006.01)
(52) U.S. Cl. ............... 361/700; 361/690; 361/695; 361/719; 361/721; 165/104.33
(58) Field of Classification Search ............... None
See application file for complete search history.

(56) References Cited

U.S. PATENT DOCUMENTS 5,784,256 A * 7/1998 Nakamura et al. ......... 361/699
6,504,711 B2 * 1/2003 Wu et al. ............... 361/679.47
6,567,271 B2 * 5/2003 Stone et al. ................. 361/724
6,804,112 B2 * 10/2004 Klimke et al. ............... 361/800
6,853,552 B2 * 2/2005 Brewer .................. 361/679.51

FOREIGN PATENT DOCUMENTS

| JP | A 2001-195569 | 7/2001 |
|----|---------------|--------|
| JP | A 2003-209769 | 7/2003 |
| JP | A 2006-100419 | 4/2006 |

* cited by examiner

*Primary Examiner*—Boris L Chervinsky
(74) *Attorney, Agent, or Firm*—Knobbe Martens Olson & Bear, LLP

(57) ABSTRACT

An electronic apparatus includes: a housing; a motherboard that is accommodated in the housing; a first daughterboard that is accommodated in the housing; a second daughterboard that is accommodated in the housing; a host controller that is mounted on the motherboard; a bridge controller that is mounted on the first daughterboard and electrically connected to the host controller; a first chip that is mounted on the first daughterboard and electrically connected to the bridge controller; and a second chip that is mounted on the second daughterboard and electrically connected to the bridge controller.

9 Claims, 11 Drawing Sheets

ELECTRONIC APPARATUS AND DAUGHTERBOARD

CROSS-REFERENCE TO RELATED APPLICATIONS

This application is based upon and claims the benefit of priority from Japanese Patent Application No. 2007-231631, filed on Sep. 6, 2007, the entire content of which are incorporated herein by reference.

BACKGROUND

1. Field

One embodiment of the invention relates to a technique related to an electronic apparatus that is installed with a plurality of circuit boards.

2. Description of the Related Art

Electronic apparatuses, such as portable computers, may be installed with a daughterboard on which a chip such as a graphic chip is mounted in addition to a motherboard on which a host controller is mounted. When a plurality of such daughterboards are installed, a bridge controller that branches a signal from the host controller is mounted on the motherboard, and a plurality of connectors for connection of a daughterboard, corresponding to the number of the daughterboards, are provided.

An example of an electronic apparatus including a motherboard and a plurality of daughterboards is disclosed in JP-A-2006-100419. A plurality of connectors to which the daughterboards are to be connected are provided in the motherboard in correspondence with the number of the daughterboards.

An electronic apparatus may be provided with an alternative model that is obtained by partially design-changing a standard model. The present inventor considers, for example, providing a model that is installed with a single daughterboard, while providing a model that is installed with multiple daughterboards.

If the motherboard is designed to be capable of the number of daughterboards as described in the document JP-A-2006-100419, it is necessary to change the motherboard in accordance with the number of daughterboards when a model in which the number of daughterboards is changed is provided. The change of the motherboard increases a burden in design changes of an electronic apparatus.

SUMMARY

According to a first aspect of the present invention, there is provided an electronic apparatus including: a housing; a motherboard that is accommodated in the housing; a first daughterboard that is accommodated in the housing; a second daughterboard that is accommodated in the housing; a host controller that is mounted on the motherboard; a bridge controller that is mounted on the first daughterboard and electrically connected to the host controller; a first chip that is mounted on the first daughterboard and electrically connected to the bridge controller; and a second chip that is mounted on the second daughterboard and electrically connected to the bridge controller.

According to a second aspect of the present invention, there is provided a daughterboard to be attached to a motherboard on which a host controller is mounted, the daughterboard including: a first connector that is to be electrically connected to the host controller; a bridge controller that is electrically connected to the first connector; a chip that is electrically connected to the bridge controller; and a second connector that is electrically connected to the bridge controller and electrically connectable to other daughterboards.

According to a third aspect of the present invention, there is provided an electronic apparatus including: a housing; a first circuit board that is accommodated in the housing; a first heating element that is mounted on the first circuit board and generates heat; a second circuit board that is accommodated in the housing so as to be overlapped on the first circuit board; and a second heating element that is mounted on the second circuit board and generates heat, wherein the first circuit board has a first board face that faces the second circuit board, the first board face being mounted with the first heating element, and wherein the second circuit board has a second board face that faces the first circuit board, the second board face being mounted with the second heating element.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Figure 1:
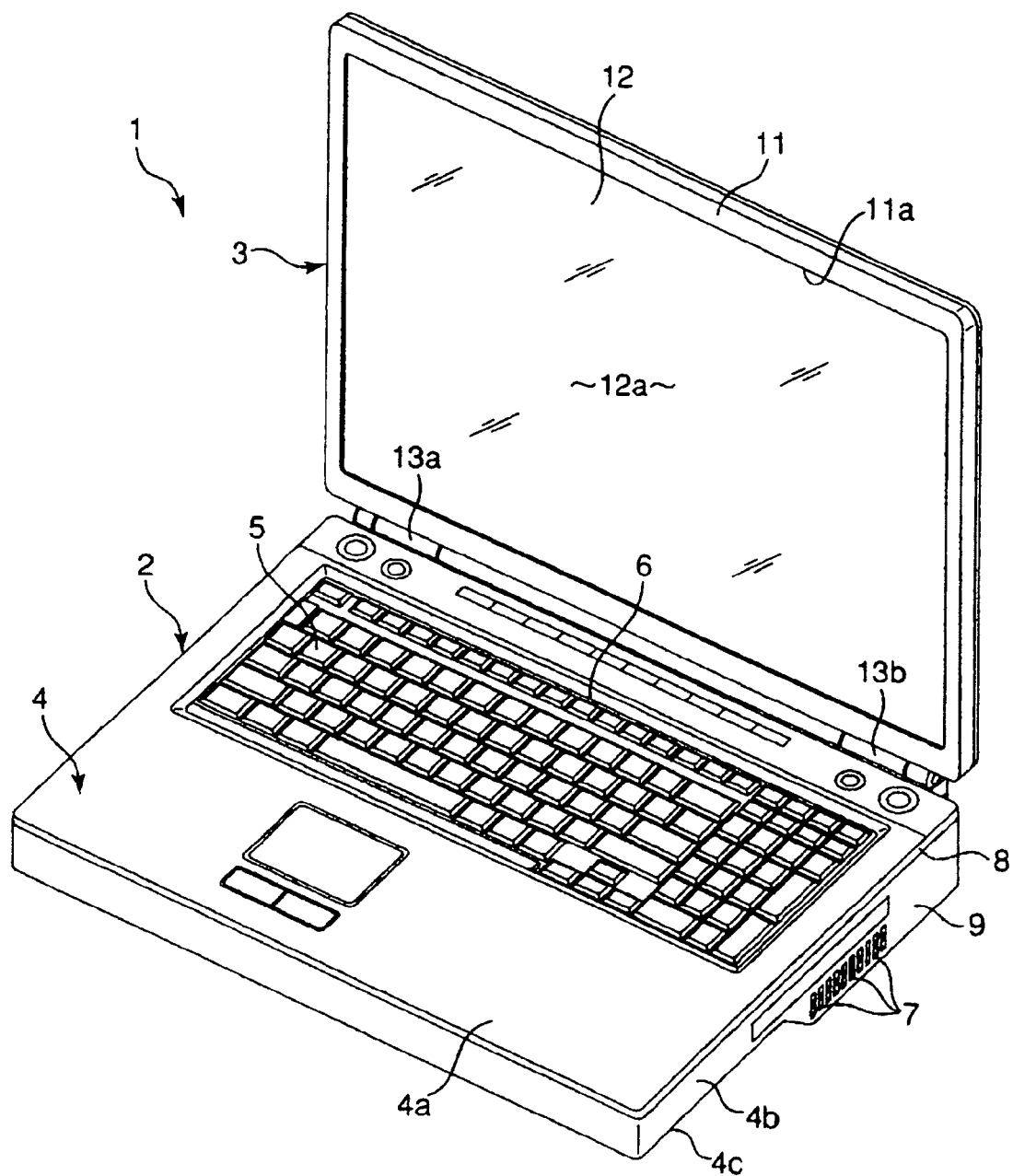
FIG. 1 is a perspective view of a portable computer according to an embodiment of the present invention.

Hereinafter, embodiments of the invention that are applied to a portable computer 1 will be described with reference to the drawings. FIGS. 1 to 9 show a portable computer 1 that serves as an electronic apparatus according to an embodiment of the present invention. As shown in FIG. 1, the portable computer 1 includes a main body 2 and a display unit 3.

The main body 2 has a housing 4 formed in a box shape. The housing 4 has an upper wall 4a, a peripheral wall 4b, and a lower wall 4c. The portable computer 1 includes a keyboard 5. The upper wall 4a is provided with a keyboard placing portion 6 on which the keyboard 5 is to be placed. Exhaust holes 7 are formed in the peripheral wall 4b. The housing 4 has a housing cover 8 including the upper wall 4a and a housing base 9 including the lower wall 4c. The housing cover 8 is combined with the housing base 9 from above, and forms an accommodation space in cooperation with the housing base 9.

The display unit 3 includes a display housing 11 and a display device 12 accommodated in the display housing 11. The display device 12 has a display screen 12a. The display screen 12a is exposed to the outside of the display housing 11 through an opening 11a of a front face of the display housing 11.

The display unit 3 is supported at a rear end of the housing 4 via a pair of hinge portions 13a and 13b. Therefore, the display unit 3 is rotatable between a closing position where it is felled so as to cover the upper wall 4a from above, and an opening where it erects so as to expose the upper wall 4a.

Figure 2:
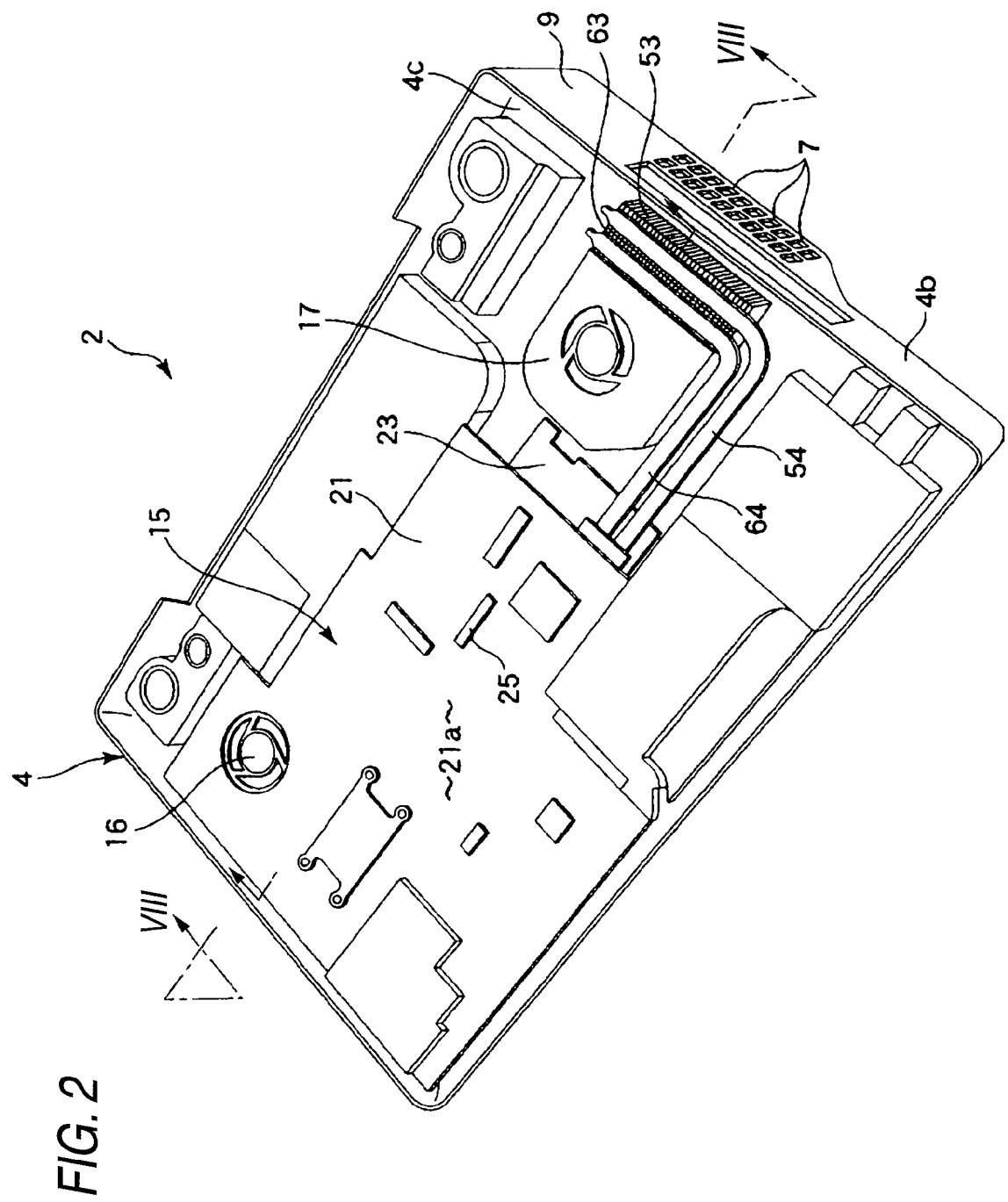
FIG. 2 is a perspective view showing the inside of a housing of the portable computer shown in FIG. 1.
Figure 3:
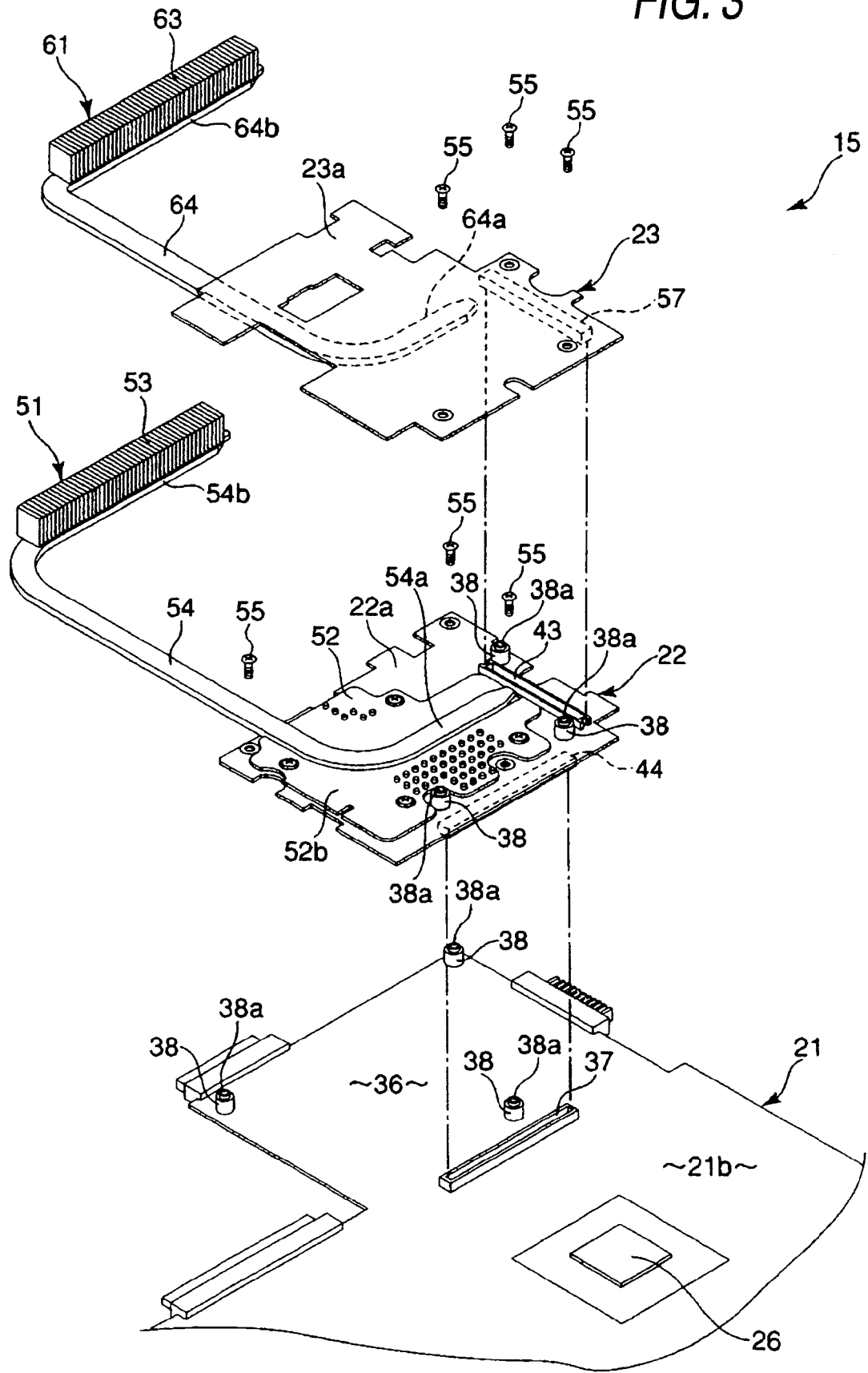
FIG. 3 is a partially exploded perspective view showing a board unit shown in FIG. 2.
Figure 8:
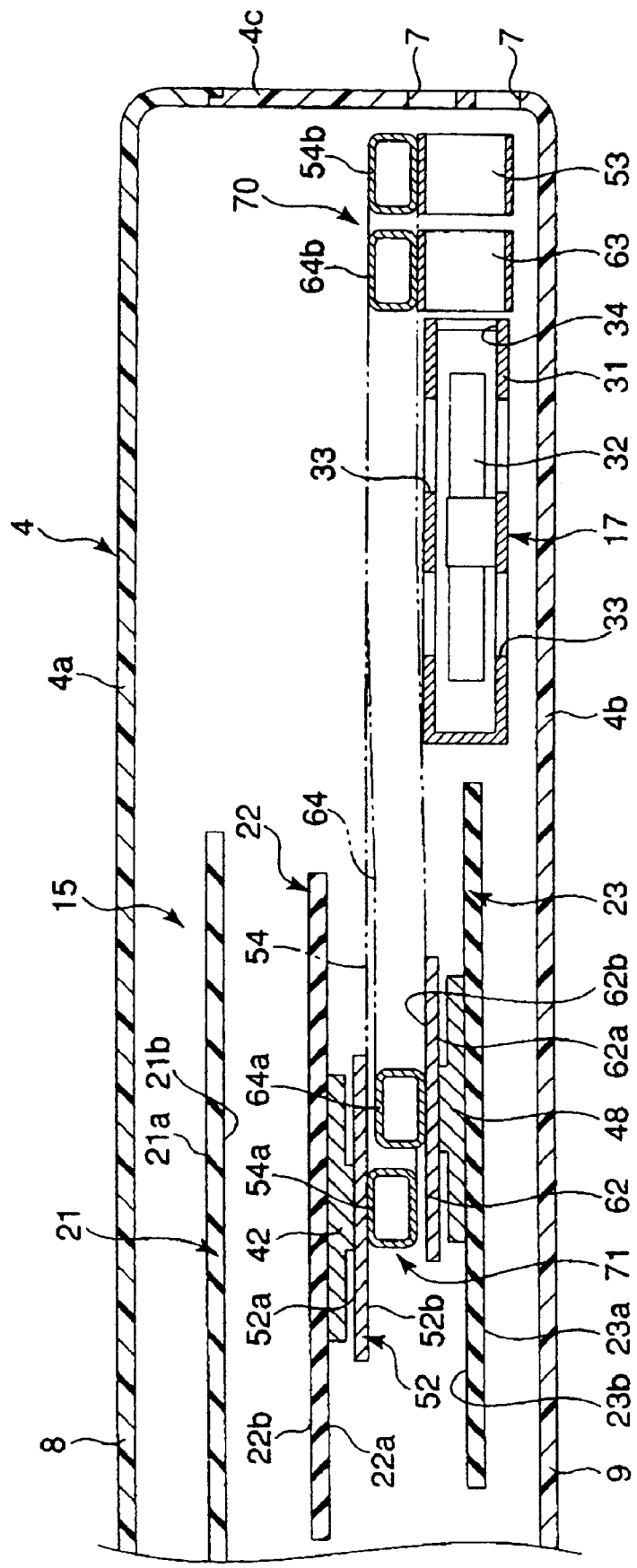
FIG. 8 is a cross-sectional view taken along the line VIII-VIII of the portable computer shown in FIG. 2.

As shown in FIG. 2, a board unit 15, a first cooling fan 16, and a second cooling fan 17 are accommodated in the housing 4. As shown in FIGS. 3 and 8, an example of the board unit 15 includes a motherboard 21, a first daughterboard 22, and a second daughterboard 23. The motherboard 21 is mounted with, for example, a CPU and a memory (not shown), and forms the core of the board unit 15.

As shown in FIG. 2 and FIG. 8, the motherboard 21 is located in the uppermost position among the above three circuit boards 21, 22, and 23 that constitute the board unit 15. The motherboard 21 has a first board face 21a that faces the keyboard 5, and a second board face 21b that becomes the reverse side of the first board face 21a. In the present embodiment, the first board face 21a is a top face, and the second board face 21b is a bottom face. The first board face 21a serves as a first motherboard face. The second board face 21b serves as a second motherboard face.

A keyboard connector 25 to which a keyboard cable (not shown) extending from the keyboard 5 is connected is mounted on the first board face 21a. FIG. 3 is an exploded perspective view when the board unit 15 is seen from the second board face 21b. As shown in FIGS. 3 and 8, the first and second daughterboards 22 and 23 are overlapped on the second board face 21b from the second board face 21b of the motherboard 21. The motherboard 21, the first daughterboard 22, and the second daughterboard 23 are overlapped and mounted along a direction perpendicular to on the second board face 21b.

Figure 4:
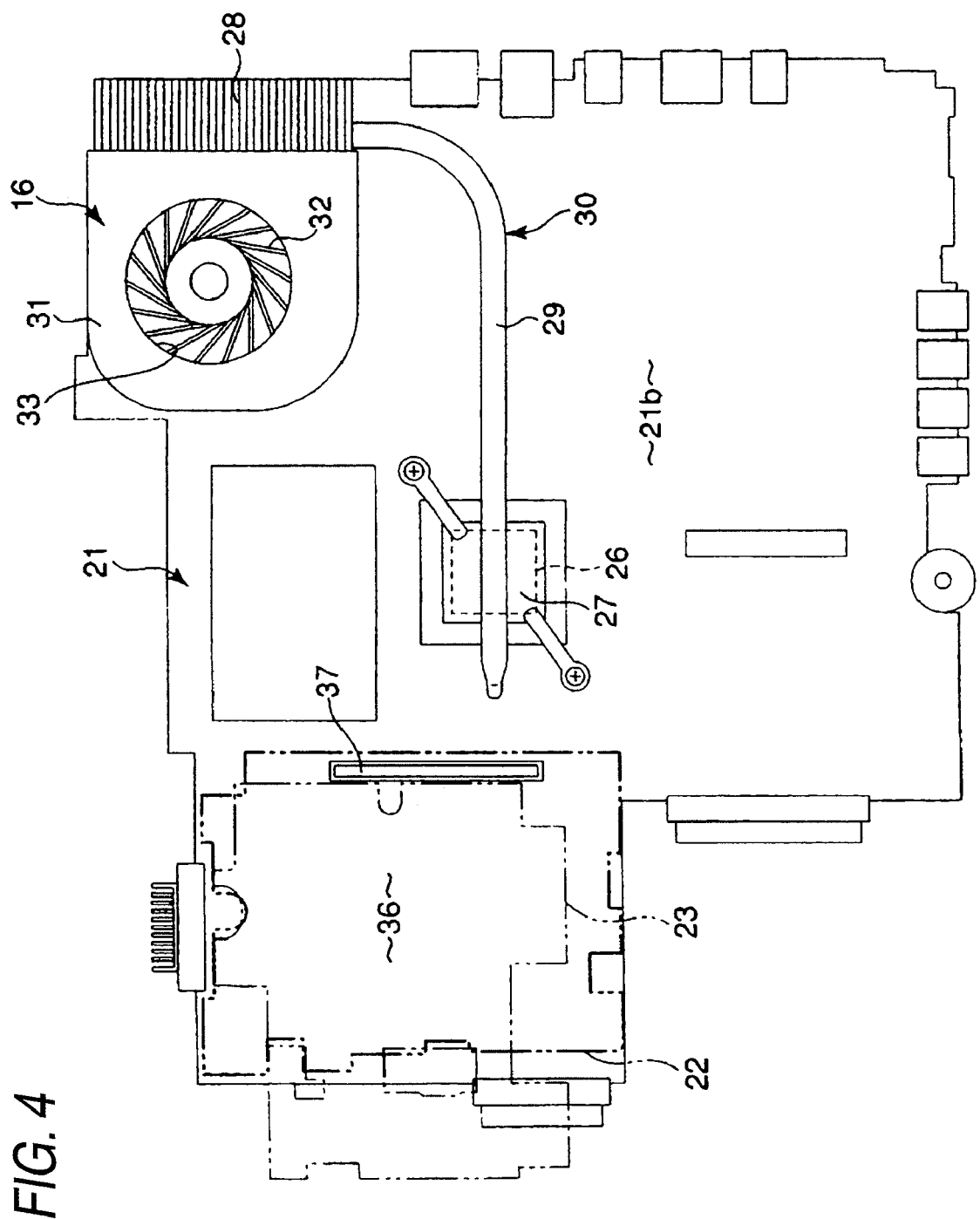
FIG. 4 is a plan view showing the bottom face of a motherboard shown in FIG. 3.

FIG. 4 shows the second board face 21b of the motherboard 21. A host controller 26 is mounted on the second board face 21b. The host controller 26 is a part that receives and transmits data among a plurality of parts. The host controller 26 serves as a northbridge.

A heat-radiating unit 30 including a heat-receiving plate 27, radiating fins 28, and a heat pipe 29 is attached to the host controller 26. Specifically, the heat-receiving plate 27 faces the host controller 26, ands is thermally connected to the host controller 26 via, for example, heat transfer grease.

The first cooling fan 16 has a fan case 31, and an impeller 32 that is rotationally driven inside the fan case 31. An intake port 33 through which the air in the housing 4 is taken into the fan case 31, and a discharge port (not shown) through which the taken-in air is discharged are provided in the fan case 31. The radiating fins 28 are arranged in a region that faces the discharge port of the first cooling fan 16. The heat pipe 29 is provided between the heat-receiving plate 27 and the radiating fins 28, and transfers the heat received by the heat-receiving plate 27 to the radiating fins 28.

As shown in FIG. 4, a daughterboard mounting region 36 on which the first and second daughterboards 22 and 23 are detachably mounted is provided in a portion of the motherboard 21. A connector 37 for connection of a first daughterboard is mounted on the daughterboard mounting region 36.

The connector 37 for connection of a first daughterboard is electrically connected to the host controller 26. As shown in FIG. 4, the first and second daughterboards 22 and 23 scarcely protrude from the daughterboard mounting region 36, and are mostly arranged within the daughterboard mounting region 36.

Further, as shown in FIG. 3, a plurality of studs 38 for fixing the first daughterboard 22 are erected from the daughterboard mounting region 36. Each of the studs 38 is fixed to the motherboard 21, and has a fixing hole 38a in which a female thread is formed.

Figure 5:
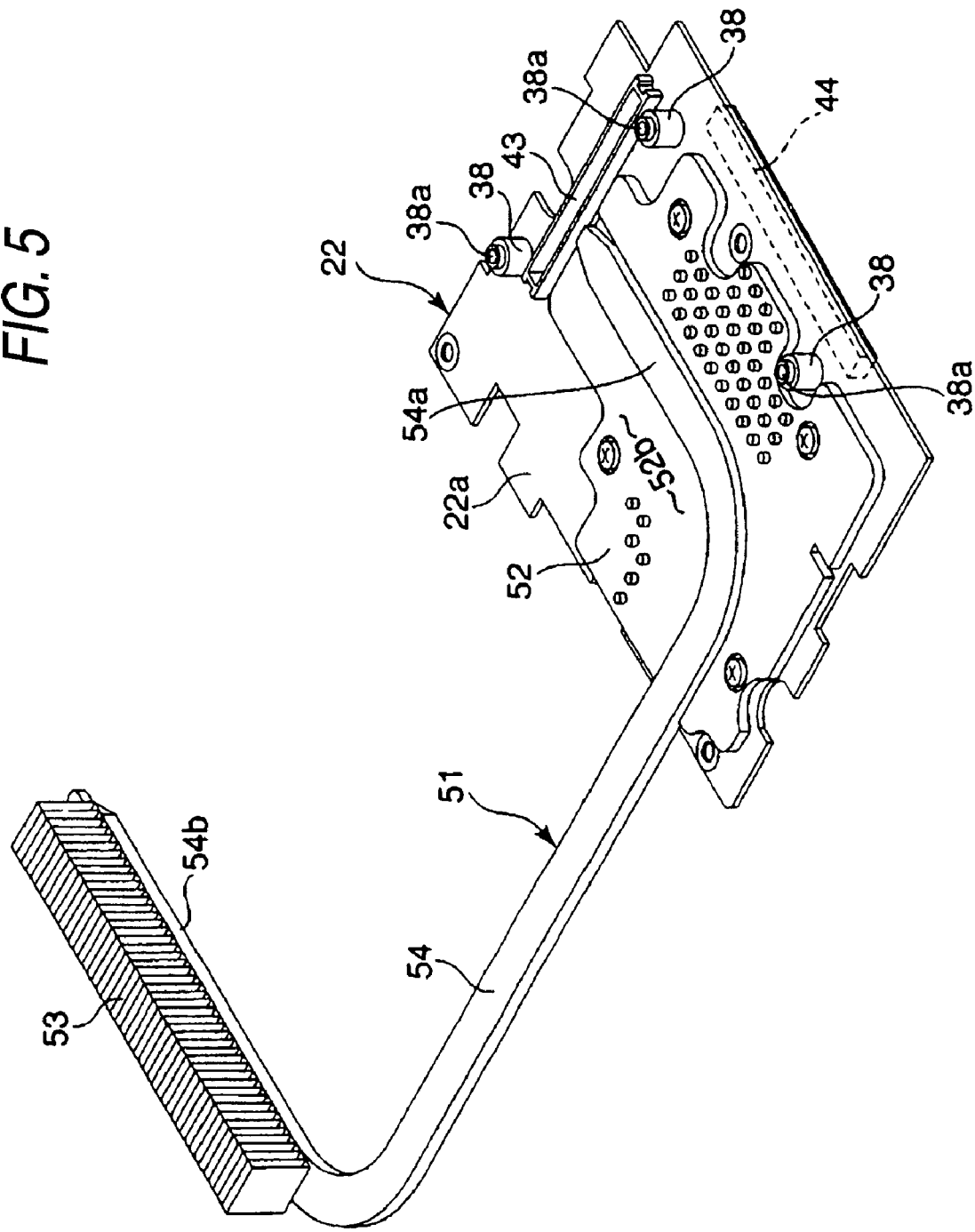
FIG. 5 is a perspective view of a first daughterboard and a first heat-radiating unit, which are shown in FIG. 3.
Figure 6:
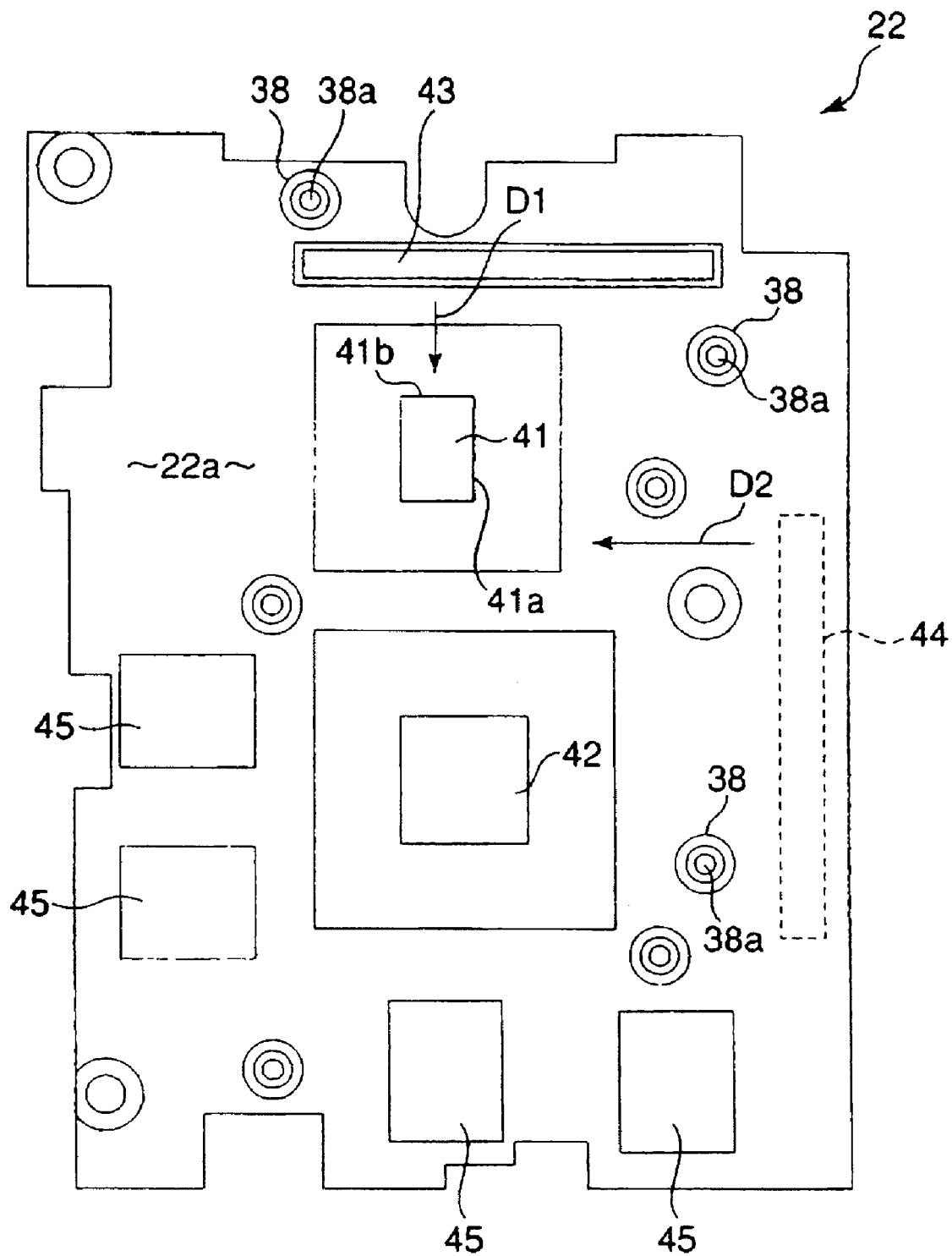
FIG. 6 is a plan view of the first daughterboard shown in FIG. 3.

FIGS. 5 and 6 show an example of the first daughterboard 22. The first daughterboard 22 has a first board face 22a that faces the second daughterboard 23, and a second board face 22b that is the reverse side of the first board face 22a, and faces the motherboard 21 (refer to FIG. 8). The first board face 22a serves as a first daughterboard face.

FIG. 6 shows the first board face 22a. As shown in FIG. 6, a bridge controller 41, a first chip 42, and a connector 43 for connection of a second daughterboard are mounted on the first board face 22a. A connector 44 for connection of a motherboard is mounted on the second board face 22b.

The bridge controller 41 is a part that branches a signal from the host controller 26. An example of the bridge controller 41 is a PCIe bridge. The first chip 42 is electrically connected to the bridge controller 41. An example of the first chip 42 is a graphic chip (Graphic Processing Unit: GPU). In the present embodiment, four VRAMs (Video Random Access Memories) 45 are mounted on the first board face 22a. Each of the VRAMs 45 is electrically connected to the first chip 42 that is a graphic chip.

The connector 44 for connection of a motherboard is an example of the first connector as used in the invention. The connector 44 for connection of a motherboard is electrically connected to the bridge controller 41. The connector 44 for connection of a motherboard is provided in a position that faces the connector 37 for connection of a first daughterboard, of the motherboard 21, and is connected to the connector 37 for connection of a first daughterboard.

The connector 44 for connection of a motherboard is electrically connected to the host controller 26 of the motherboard 21 via the connector 37 for connection of a first board. This allows the connector 44 for connection of a motherboard to electrically connect the bridge controller 41 to the host controller 26.

The connector 43 for connection of a second daughterboard, i.e., a connector that can be electrically connected to other daughterboards, is an example of a second connector as used in the invention. The connector 43 for connection of a second daughterboard is electrically connected to the bridge controller 41, and is connected to a connector 57 for connection of a first daughterboard, which is mounted on the second daughterboard 23. This allows the connector 43 for connection of a second daughterboard to electrically connect the bridge controller 41 to a second chip 48 of the second daughterboard 23. In addition, parts mounted on the second daughterboard 23 will be described below in detail.

Here, the connector 44 for connection of a motherboard and the connector 43 for connection of a second daughterboard have a number of contact pins that exceeds, for example, 200. That is, the connector 43, 44 has relatively many wiring lines to be connected, in the first daughterboard 22.

As shown in FIG. 6, a direction D1 that turns to the bridge controller 41 from the connector 43 for connection of a second daughterboard has a phase difference of at least 90 degrees with respect to a direction D2 that turns to the bridge controller 41 from the connector 44 for connection of a motherboard.

That is, the connector 43 for connection of a second daughterboard is mounted on the region of the first daughterboard 22 out of a region between the connector 44 for connection of a motherboard, and the bridge controller 41. In the present embodiment, the longitudinal direction of the connector 44 for connection of a motherboard is orthogonal to the longitudinal direction of the connector 43 for connection of a second daughterboard. In addition, although the present embodiment has shown the example in which the direction D1 has a phase difference of 90 degrees with respect to the direction D2, the difference may exceed, for example, 90 degrees.

In other words, the bridge controller 41 is formed in the shape of a rectangle having four sides. As shown in FIG. 6, when the first daughterboard 22 is seen in a horizontal projection plane, a side 41a of the bridge controller 41 that faces the connector 44 for connection of a motherboard, and a side 41b of the bridge controller 41 that faces the connector 43 for connection of a second daughterboard are different from each other.

As shown in FIG. 5, a first heat-radiating unit 51 is attached to the first daughterboard 22. The first heat-radiating unit 51 includes a first heat-receiving plate 52, first radiating fins 53, and a first heat pipe 54. The first heat-receiving plate 52 faces the first board face 22a, and is thermally connected to the first chip 42, the bridge controller 41, and four VRAMs 45 via, for example, heat transfer grease. The first heat-receiving plate 52 has a first face 52a that faces the first chip 42, and a second face 52b that becomes the reverse side of the first face 52a (refer to FIG. 8).

As shown in FIG. 2, the second cooling fan 17 has a fan case 31, and an impeller 32 that is rotationally driven inside the fan case 31. An intake port 33 through which the air in the housing 4 is taken into the fan case 31, and a discharge port 34 through which the taken-in air is discharged are provided in the fan case 31.

As shown in FIGS. 2 and 8, the first radiating fins 53 are arranged in a region between the discharge port 34 of the second cooling fan 17, and the exhaust holes 7 of the housing 4. The first heat pipe 54 is provided between the first heat-receiving plate 52 and the first radiating fins 53. The first heat pipe 54 is provided along the second face 52b of the first heat-receiving plate 52, and extends substantially in the horizontal direction. The first heat pipe 54 has a heat-receiving end 54a thermally connected to the first chip 42 via the first heat-receiving plate 52, and a heat-radiating end 54b thermally connected to the first radiating fins 53. The first heat pipe 54 transfers the heat received by the first heat-receiving plate 52 to the first radiating fins 53.

As shown in FIG. 3, the first daughterboard 22 is fastened to the studs 38 erected from the motherboard 21 with, for example, screws 55. A plurality of studs 38 for fixing the second daughterboard 23 are erected from the first daughterboard 22. Each of the studs 38 is fixed to, for example, the first daughterboard 22, and has a fixing hole 38a in which a female thread is formed.

Figure 7:
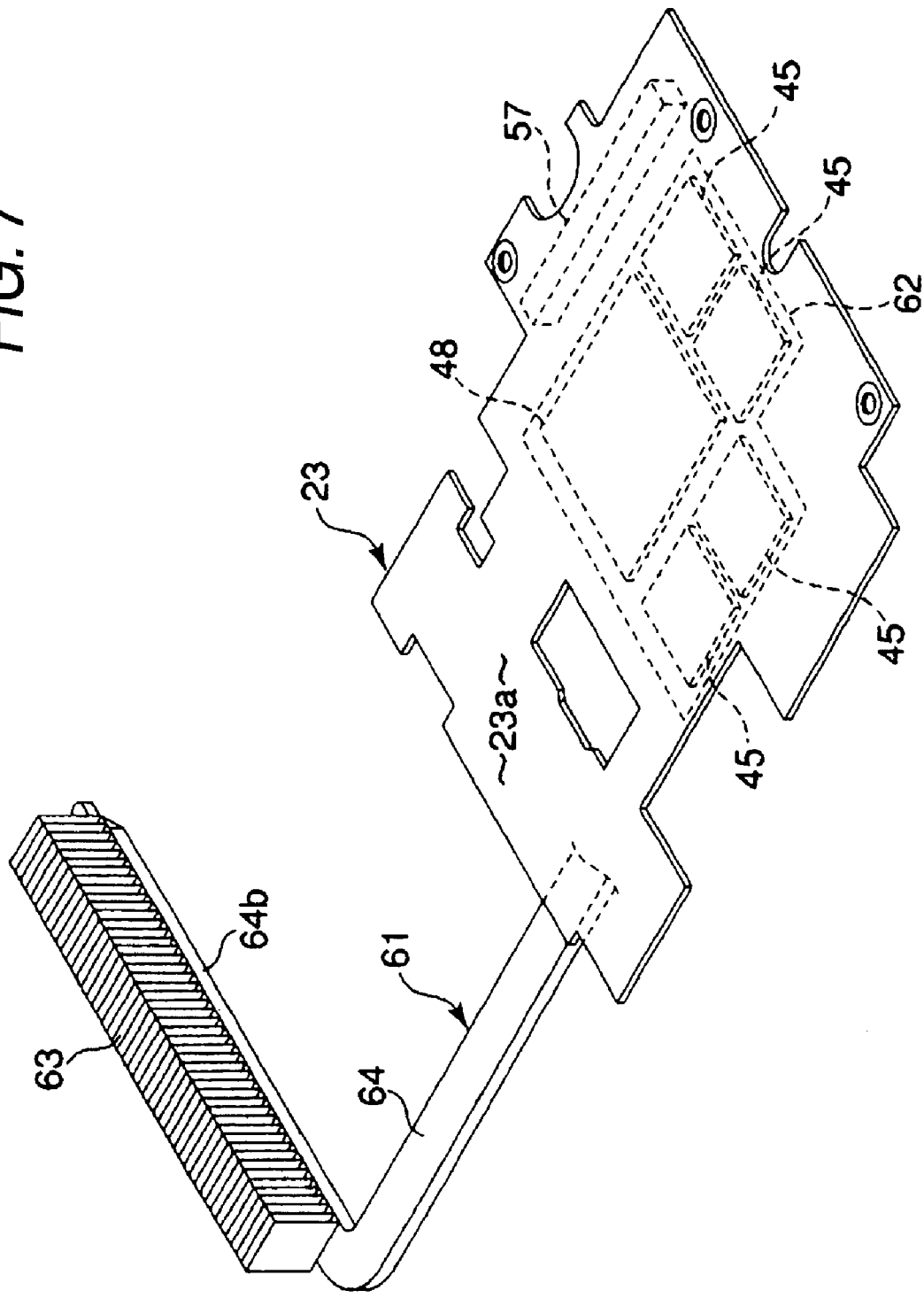
FIG. 7 is a perspective view of a second daughterboard and a second heat-radiating unit, which are shown in FIG. 3.

FIGS. 7 and 6 show an example of the second daughterboard 23. As shown in FIG. 8, the second daughterboard 23 has a first board face 23a that faces the lower wall 4c of the housing 4, and a second board face 23b that becomes the reverse side of the first board face 23a, and faces the first daughterboard 22. The second board face 23b is an example of a second daughterboard face as used in the invention.

As shown in FIG. 7, the second chip 48, and a connector 57 for connection of a first daughterboard are mounted on the second board face 23b. The second chip 48 is electrically connected to the bridge controller 41 of the first daughterboard 22 via the connector 57 for connection of a first daughterboard. An example of the second chip 48 is a graphic chip. In the present embodiment, for example, four VRAMs 45 are further mounted on the second board face 23b. Each of the VRAMs 45 is electrically connected to the second chip 48 that is a graphic chip.

The connector 57 for connection of a first daughterboard is provided in a position that faces the connector 43 for connection of a second daughterboard, of the first daughterboard 22, and is connected to the connector 43 for connection of a second daughterboard. This allows the connector 57 for connection of a first daughterboard to electrically connect the second chip 48 to the bridge controller 41 of the first daughterboard 22.

As shown in FIG. 7, the second heat-radiating unit 61 is attached to the second daughterboard 23. The second heat-radiating unit 61 includes a second heat-receiving plate 62, second radiating fins 63, and a second heat pipe 64. The second heat-receiving plate 62 faces the second board face 23b of the second daughterboard 23, and is thermally connected to the second chip 48 and the four VRAMs 45 via, for example, heat transfer grease. As shown in FIG. 8, the second heat-receiving plate 62 has a first face 62a that faces the second chip 48, and a second face 62b that becomes the reverse side of the first face 62a.

As shown in FIGS. 2 and 8, the second radiating fins 63 are arranged in a region between the discharge port 34 of the second cooling fan 17, and the exhaust holes 7 of the housing 4. The second heat pipe 64 is provided between the second heat-receiving plate 62 and the second radiating fins 63. The second heat pipe 64 is provided along the second face 62b of the second heat-receiving plate 62, and extends substantially in the horizontal direction. The second heat pipe 64 has a heat-receiving end 64a thermally connected to the second chip 48 via the second heat-receiving plate 62, and a heat-radiating end 64b thermally connected to the second radiating fins 63. The second heat pipe 64 transfers the heat received by the second heat-receiving plate 62 to the second radiating fins 63.

As shown in FIG. 8, the second radiating fins 63 are mounted at the same height position as the first radiating fins 53 in a region that faces the discharge port 34 of the second cooling fan 17. The first and second radiating fins 53 and 63 are arranged back and forth along a direction (that is, the discharge direction of air of the cooling fan 17) that turns to the exhaust holes 7 of the housing 4 from the second cooling fan 17. One cooling fan 17 cools both the first and second radiating fins 53 and 63. As shown in FIG. 3, the second daughterboard 23 is fastened to the studs 38 erected from the first motherboard 22 with, for example, screws 55.

In the present embodiment, the first and second cooling units 51 and 61 serve as an example of a heat radiating mechanism 70 that cools the first and second chips 42 and 48. As shown in FIG. 8, the heat radiating mechanism 70 has a heat receiving unit 71 including the first and second heat-receiving plates 52 and 62 and the heat-receiving ends 54a and 64a of the first and second heat pipes 54 and 64. The heat receiving unit 71 receives heat from the first and second chips 42 and 48. The heat receiving unit 71 is provided between the first daughterboard 22 and the second daughterboard 23.

As shown in FIG. 8, in the present embodiment, the first and second heat pipes 54 and 64 are partially overlapped on each other along a direction parallel to the first board face 22a of the first daughterboard 22 in a region between the first daughterboard 22 and the second daughterboard 23. In addition, the first and second heat pipes 54 and 64 may be entirely overlapped on each other, for example, along a direction parallel to the first board face 22a of the first daughterboard 22.

As shown in FIG. 8, the second heat pipe 64 is slightly bent upward, and the heat-radiating end 64b is located slightly above the heat-receiving end 64a. This absorbs the difference of the mounting height between the heat-receiving end 54a of the first heat pipe 54 and the heat-receiving end 64a of the second heat pipe 64, thereby adjusting the heat-radiating end 54b of the first heat pipe 54 and the heat-radiating end 64b of the second heat pipe 64 to the same height.

Figure 9:
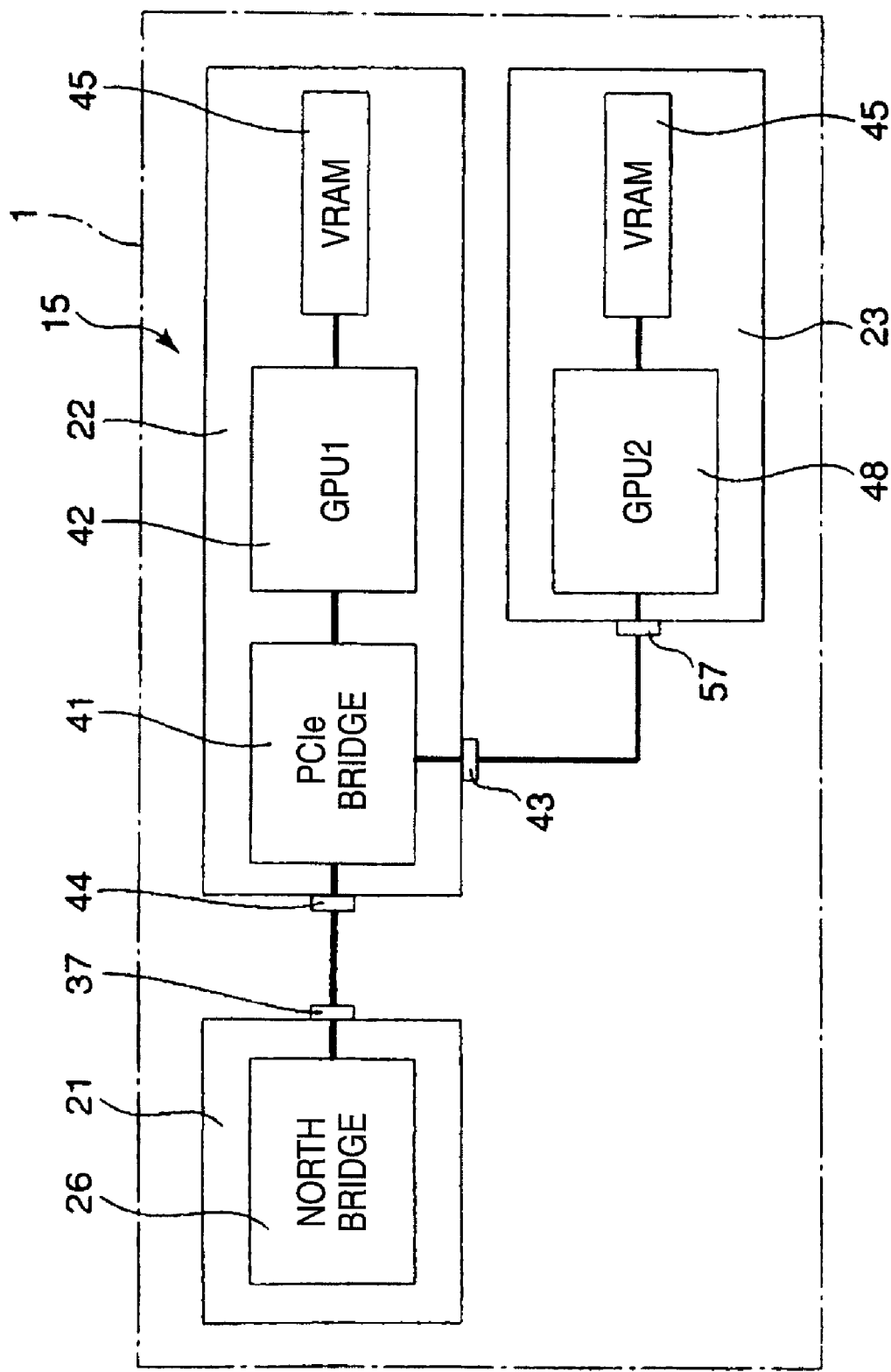
FIG. 9 is a system configuration diagram of the portable computer.

As shown in FIG. 9, the example of the portable computer 1 described above has two graphic systems including two daughterboards 22 and 23, each of which is mounted with a GPU.

Next, a portable computer 81 having one graphic system, which is a modification of a portable computer 1, will be described with reference to FIG. 10. In addition, components having functions that are the same as or similar to the respective components of the portable computer 1 are denoted by the same reference numerals, and the description thereof will be omitted herein. The portable computer 81 is different from the portable computer 1 in the number of daughterboards to be installed, and is the same as the portable computer 1 in basic configuration. A motherboard 21 of the portable computer 81 is the same as the motherboard 21 of the portable computer 1.

Figure 10:
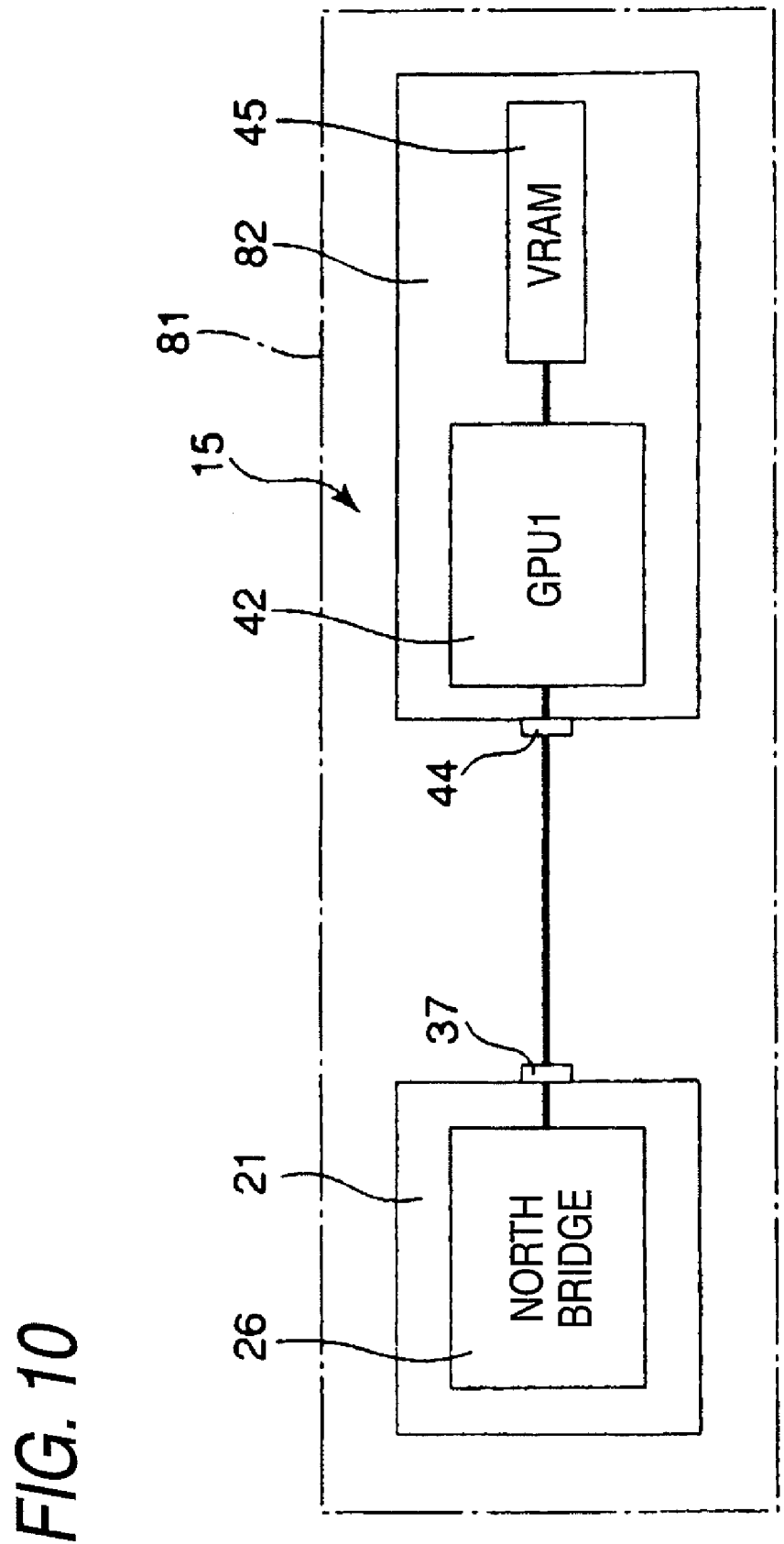
FIG. 10 is a system configuration diagram of a portable computer according to a modification of the embodiment.

As shown in FIG. 10, the portable computer 81 includes one daughterboard 82. One chip 42, and a connector 44 for connection of a motherboard are mounted on the daughterboard 82. The chip 42 is electrically connected to the connector 44 for connection of a motherboard. The chip 42 is electrically connected to a host controller 26 of the motherboard 21 via the connector 44 for connection of a motherboard.

An example of the chip 42 is a graphic chip. For example, four VRAMs 45 are further mounted on the daughterboard 82. The VRAMs 45 are electrically connected to the chip 42.

Next, a portable computer 91 having three graphic systems, which is another example of the modification of the portable computer 1, will be described with reference to FIG. 11. In addition, components having functions that are the same as or similar to the respective components of the portable computer 1 are denoted by the same reference numerals, and the description thereof will be omitted herein. The portable computer 91 is different from the portable computer 1 in the number of daughterboards to be installed, and is the same as the portable computer 1 in basic configuration. A motherboard 21 of the portable computer 91 is the same as the motherboard 21 of the portable computer 1.

Figure 11:
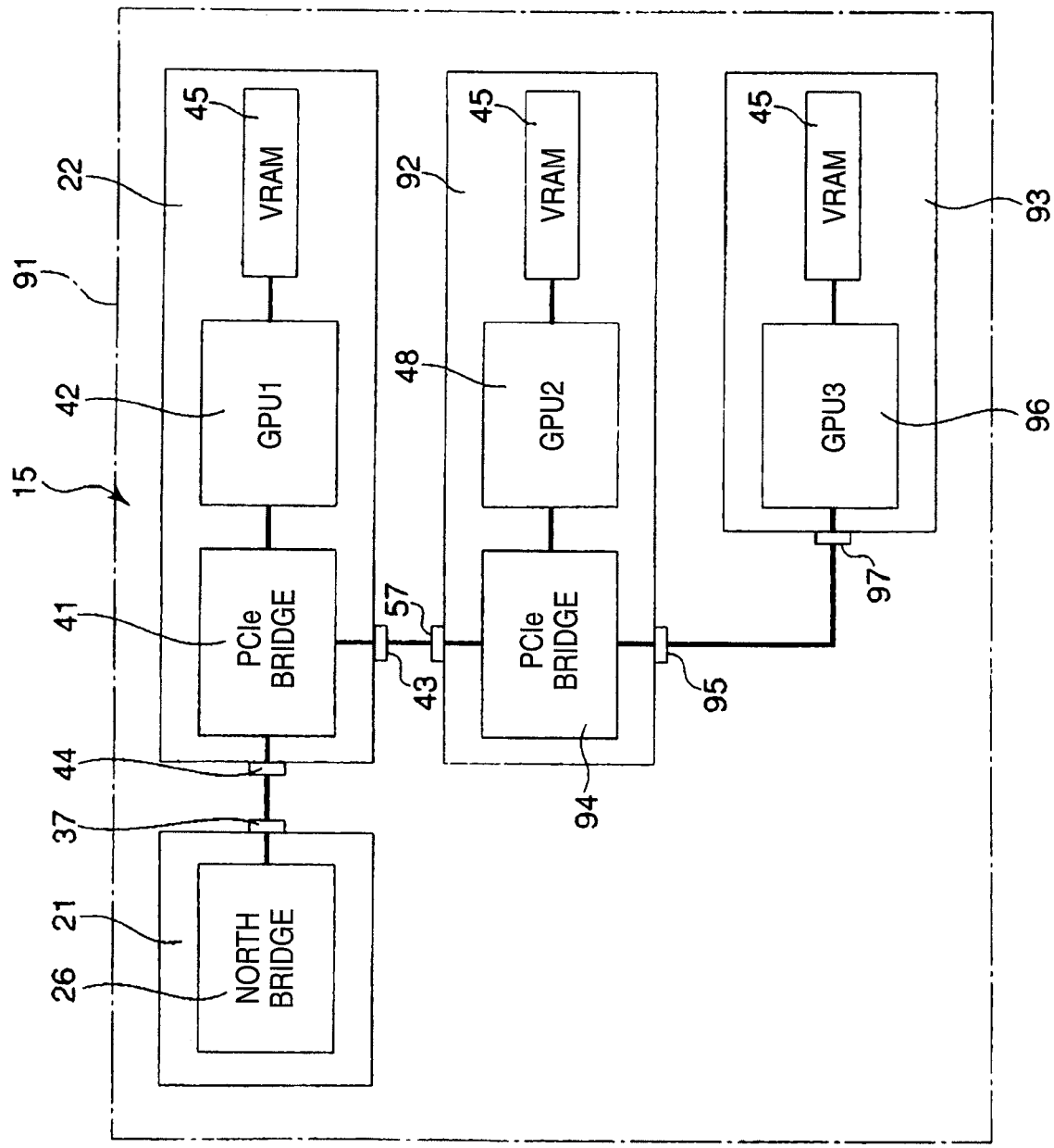
FIG. 11 is a system configuration diagram of a portable computer according to another modification of the embodiment.

As shown in FIG. 11, the portable computer 91 includes three daughterboards 22, 92, and 93, each of which being mounted with a GPU. A first daughterboard 22 of the portable computer 91 is the same as the first daughterboard 22 of the portable computer 1.

A second bridge controller 94 serving as another bridge controller, a second chip 48, a connector 57 for connection of a first daughterboard, and a connector 95 for connection of a third daughterboard are mounted on the second daughterboard 92. The second bridge controller 94 is electrically connected to the connector 57 for connection of a first daughterboard.

The connector 57 for connection of a first daughterboard is connected to the connector 43 for connection of a second daughterboard, of the first daughterboard 22. This allows the second chip 94 to be electrically connected to the bridge controller 41 of the first daughterboard 22 via the connector 57 for connection of a first daughterboard. An example of the second bridge controller 2 is a PCIe bridge.

The second chip 48 is electrically connected to the second bridge controller 94. The connector 95 for connection of a third daughterboard is electrically connected to the second bridge controller 94.

A third chip 96 and a connector 97 for connection of a second daughterboard are mounted on the third daughterboard 93. The third chip 96 is electrically connected to the connector 97 for connection of a second daughterboard. The connector 97 for connection of a second daughterboard is connected to the connector 95 for connection of a third daughterboard, of the second daughterboard 92. This allows the third chip 96 to be electrically connected to the second bridge controller 94. An example of the third chip 96 is a graphic chip. For example, four VRAMs 45 are further mounted on the third daughterboard 93. The VRAMs 45 are electrically connected to the third chip 96.

In this portable computer 91, the motherboard 21, the first daughterboard 22, the second daughterboard 92, and the third daughterboard 93 are mounted so as to be overlapped on one another along a direction perpendicular to the second board face 21b of the motherboard 21.

According to the portable computer 1 having the above configuration, design changes of an electronic apparatus can be performed easily. That is, the design changes between a model installed with one daughterboard and a model installed with two or more daughterboards can be performed without changing the motherboard 21 by mounting the bridge controller 41 not on the motherboard 21 but on the daughterboard 22. That is, changes between a plurality of models can be made only by replacing a daughterboard.

For example, to explain an electronic apparatus provided with a graphic system as an example, the number of GPUs to be provided on an electronic apparatus can be freely selected without any change of the motherboard 21 by mounting the bridge controller 41 on the daughterboard 22.

Since the change of the motherboard 21 needs large design changes in a whole electronic apparatus, a burden in the design changes between a plurality of models will increase if the motherboard 21 is changed. Meanwhile, if design changes can be performed between a plurality of models without changing the motherboard 21, they will be merely comparatively small design changes in a whole electronic apparatus. Thus, design changes of the electronic apparatus can be performed easily.

For example, if any bridge controllers or daughterboard connectors that is not in-use exist on a motherboard, the mounting space of the motherboard will be limited as much. On the other hand, in the portable computer according to the present embodiment, even if the design changes between several models that are different from each other in the number of daughterboards are performed, the bridge controller 41 or daughterboard connectors that is not in-use exist. That is, the mounting space of the motherboard 21 is used effectively, and thus, a portable computer capable of promoting optimization is provided.

If the motherboard 21, the first daughterboard 22, and the second daughterboard 23 are mounted so as to be overlapped on one another along the direction perpendicular to the second board face 21b of the motherboard 21, the horizontal width and depth of the portable computer 1 is not easily influenced by the number of daughterboards.

That is, the horizontal width and width of the portable computer 1 are not almost design-changed by mounting a plurality of chips 42 and 48 on a plurality of daughterboards 22 and 23 in a distributed manner, and mounting the plurality of daughterboards 22 and 23 so as to be overlapped on the motherboard 21, and the design changes between a plurality of models can be performed by design-changing the thickness of the portable computer 1 according to needs. Since the design change of the thickness of the portable computer 1 is easy compared with the design change of horizontal width or width, design changes of an electronic apparatus can be performed more easily.

Moreover, design changes related to the arrangement of parts around a daughterboard can be reduced by mounting a plurality of chips 42 and 48 on a plurality of daughterboards 22 and 23 in a distributed manner, and mounting the plurality of daughterboards 22 and 23 so as to be overlapped on the motherboard 21.

If the position of the motherboard 21 with respect to the upper wall 4a of the housing 4 is changed, it will be necessary to change all the positions of various ports. Therefore, large design changes in a whole electronic apparatus are needed. On the other hand, if a plurality of daughterboards are stacked so as to be overlapped on the second board face 21b of the motherboard 21 that does not face the keyboard 5 like the present embodiment, it is not necessary to change the position of the motherboard 21 with respect to the upper wall 4a of the housing 4. This makes it possible to easily perform design changes of an electronic apparatus without requiring design changes of various ports, etc.

If the direction D2 that turns to the bridge controller 41 from the connector 44 for connection of a motherboard has a phase difference of at least 90 degrees with respect to the direction D1 that turns to the bridge controller 41 from the connector 43 for connection of a second daughterboard, it is possible to control the intersection between a group of wiring lines that connects the connector 44 for connection of a motherboard and the bridge controller 41 to each other, and a group of wiring lines that connects the connector 43 for connection of a second daughterboard and the bridge controllers 41 to each other. Accordingly, the wiring layout of the first daughterboard 22 becomes easy.

Furthermore, according to the configuration of the present embodiment, an arbitrary number of daughterboards can be installed onto the motherboard 21 by preparing a plurality of daughterboards, each of which mounted with a bridge controller.

At this time, a plurality of daughterboards can be formed with almost the same size not by mounted with a plurality of bridge controllers on one daughterboard, but by mounted with a required number of bridge controllers on a plurality of daughterboards in a distributed manner. If a plurality of daughterboards are formed with almost the same size, the horizontal width or width is hardly increased even in a portable computer installed with a plurality of daughterboards. That is, the design changes between a plurality of models can be performed, without nearly performing design changes of the horizontal width and width of the portable computer 1.

For example, if a plurality of circuit boards, such as daughterboards, are overlapped on each other, an electronic apparatus tends to become thick. The electronic apparatus according to one aspect aiming at making the apparatus thin includes a housing, a first circuit board accommodated in the housing, a first heating element mounted on the first circuit board, a second circuit board accommodated in the housing so as to be overlapped on the first circuit board, and a second heating element mounted on the second circuit board. The first circuit board has a first board face that faces the second circuit board, the first heating element is mounted on the first board face, the second circuit board has a second board face that faces the first circuit board, and the second heating element is mounted on the second board face.

Here, the first daughterboard 22 is an example of the first circuit board. The first chip 42 is an example of the first heating element. The second daughterboard 23 is an example of the second circuit board. The second chip 48 is an example of the second heating element. The first board face 22a of the first daughterboard 22 is an example of the first board face that faces the second circuit board. The second board face 23b of the second daughterboard 23 is an example of the second board face that faces the first circuit board.

If the first chip 42 is mounted on the first board face 22a of the first daughterboard 22, and the second chip 48 is mounted on the second board face 23b of the second daughterboard 23, the first and second chips 42 and 48 can be collectively mounted between the first and second daughterboards 22 and 23. This allows the portable computer 1 to be thin.

Furthermore, if the first chip 42 is mounted on the first board face 22a of the first daughterboard 22, and the second chip 48 is mounted on the second board face 23b of the second daughterboard 23, the heat radiating mechanism 70 that cools the first and second chips 42 and 48 can be collectively arranged between the first daughterboard 22 and the second daughterboard 23. This allows the portable computer 1 to be thin.

In particular, if the first and second heat pipes 54 and 64 are partially overlapped on each other along a direction parallel to the first board face 22a in a region between the first daughterboard 22 and the second daughterboard 23, a dead space produced by mounting of the heat pipes 54 and 64 can be suppressed low, and the portable computer 1 can be made thinner.

If the first and second radiating fins 53 and 63 are juxtaposed to each other in a region that faces the discharge port 34 of the cooling fan 17, the two radiating fins 53 and 63 can be cooled by one cooling fan 17. This contributes to miniaturization and thinning of the portable computer 1.

Although the portable computer 1 according to one embodiment of the invention has been described hitherto, the invention is not limited thereto. For example, an electronic apparatus installed with four or more daughterboards can be made thin by using the invention.

What is claimed is:

1. An electronic apparatus comprising:
a housing;
a motherboard in the housing;
a first daughterboard in the housing;
a second daughterboard in the housing;
a host controller mounted on the motherboard;
a bridge controller mounted on the first daughterboard, electrically connected to the host controller, and configured to branch a signal from the host controller;
a first chip mounted on the first daughterboard and electrically connected to the bridge controller; and
a second chip mounted on the second daughterboard and electrically connected to the bridge controller.

2. The apparatus of claim 1,
wherein the motherboard comprises a board face on which the host controller is mounted, and
wherein the motherboard, the first daughterboard, and the second daughterboard are arranged so as to overlap on one another in a direction perpendicular to the board face of the motherboard.

3. The apparatus of claim 2,
wherein the first daughterboard comprises a first daughterboard face configured to face the second daughterboard, the first daughterboard face being mounted with the first chip, and
wherein the second daughterboard comprises a second daughterboard face configured to face the first daughterboard, the second daughterboard face being mounted with the second chip.

4. The apparatus of claim 3 further comprising a heat radiating mechanism provided with a heat receiving unit configured to receive heat from the first chip and the second chip and configured to radiate the heat,
wherein the heat receiving unit is located between the first daughterboard and the second daughterboard.

5. The apparatus of claim 4, wherein the heat radiating mechanism is provided with a first heat pipe thermally connected to the first chip and a second heat pipe thermally connected to the second chip,
wherein the first heat pipe and the second heat pipe are at least partially overlapped on each other along a direction parallel to the first daughterboard face in a region between the first daughterboard and the second daughterboard.

6. The apparatus of claim 5 further comprising:
a cooling fan in the housing comprising a discharge port through which air is discharged;
first radiating fins thermally connected to the first heat pipe; and
second radiating fins thermally connected to the second heat pipe,
wherein the first radiating fins and the second radiating fins are mounted, configured to be juxtaposed in a region facing the discharge port of the cooling fan.

7. The apparatus of claim 6 further comprising:
a first connector mounted on the first daughterboard to electrically connect the bridge controller to the host controller of the motherboard; and
a second connector mounted on the first daughterboard to electrically connect the bridge controller to the second chip of the second daughterboard,
wherein an angle between a first axis between the bridge controller and the second connector and a second axis between the bridge controller and the first connector is at least 90 degrees.

8. The apparatus of claim 7 further comprising a keyboard that allows key input,
wherein the motherboard comprises a first motherboard face configured to face the keyboard and a second motherboard face opposite to the first motherboard face, and
wherein the first daughterboard and the second daughterboard are overlapped on the second motherboard face.

9. The apparatus of claim 2 further comprising:
a third daughterboard in the housing;
a secondary bridge controller mounted on the second daughterboard and electrically connected to the bridge controller of the first daughterboard; and
a third chip mounted on the third daughterboard and electrically connected to the secondary bridge controller of the second daughterboard.

* * * * *